United States Patent
Wu et al.

(10) Patent No.: US 12,432,883 B2
(45) Date of Patent: Sep. 30, 2025

(54) TWO-PHASE IMMERSION-TYPE HEAT DISSIPATION STRUCTURE HAVING ACUTE-ANGLE NOTCHED STRUCTURES

(71) Applicant: AMULAIRE THERMAL TECHNOLOGY, INC., New Taipei (TW)

(72) Inventors: Chun-Te Wu, New Taipei (TW); Ching-Ming Yang, New Taipei (TW); Yu-Wei Chiu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 350 days.

(21) Appl. No.: 17/980,626

(22) Filed: Nov. 4, 2022

(65) Prior Publication Data
US 2024/0155807 A1 May 9, 2024

(51) Int. Cl.
  *H05K 7/20* (2006.01)
(52) U.S. Cl.
  CPC .......... *H05K 7/2039* (2013.01); *H05K 7/203* (2013.01)
(58) Field of Classification Search
  CPC ......... H05K 7/203; H05K 7/2039; F28F 3/02; F28F 2215/00; H01L 23/44; H01L 23/473; H01L 23/3672
  See application file for complete search history.

(56) References Cited

U.S. PATENT DOCUMENTS

| | | | | |
|---|---|---|---|---|
| 4,369,838 A * | 1/1983 | Asanuma | ............ | H01L 23/4006 257/722 |
| 4,549,606 A * | 10/1985 | Sato | ......................... | F28F 1/36 165/184 |
| 6,173,762 B1 * | 1/2001 | Ishida | .................... | F28F 13/187 165/184 |
| 2009/0025912 A1 * | 1/2009 | Chang | ....................... | F28F 3/04 361/710 |
| 2020/0214169 A1 * | 7/2020 | Tsunoda | ............. | H05K 7/20245 |

* cited by examiner

*Primary Examiner* — Gordon A Jones
(74) *Attorney, Agent, or Firm* — Li & Cai Intellectual Property (USA) Office

(57) ABSTRACT

A two-phase immersion-type heat dissipation structure having acute-angle notched structures is provided. The two-phase immersion-type heat dissipation structure includes a heat dissipation substrate, and a plurality of fins. The heat dissipation substrate has a fin surface and a non-fin surface that face away from each other, the non-fin surface is configured to be in contact with a heat source immersed in a two-phase coolant, and the fin surface is connected with the fins. More than half of the fins are functional fins, and at least one side surface of each of the functional fins has first and second surfaces defined thereon and connected to each other. An angle between the first surface and the fin surface is from 80 degrees to 100 degrees, and an angle between the second surface and the fin surface is less than 75 degrees.

5 Claims, 4 Drawing Sheets

TWO-PHASE IMMERSION-TYPE HEAT DISSIPATION STRUCTURE HAVING ACUTE-ANGLE NOTCHED STRUCTURES

FIELD OF THE DISCLOSURE

The present disclosure relates to a heat dissipation structure, and more particularly to a two-phase immersion-type heat dissipation structure having acute-angle notch structures.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having acute-angle notched structures.

In one aspect, the present disclosure provides a two-phase immersion-type heat dissipation structure. The two-phase immersion-type heat dissipation structure includes a heat dissipation substrate, and a plurality of fins. The heat dissipation substrate has a fin surface and a non-fin surface that face away from each other, the non-fin surface is configured to be in contact with a heat source immersed in a two-phase coolant, and the fin surface is connected with the plurality of fins. More than half of the plurality of fins are functional fins, and at least one side surface of each of the functional fins has a first surface and a second surface defined thereon that are connected to each other. An angle between the first surface and the fin surface is from 80 degrees to 100 degrees, and an angle between the second surface and the fin surface is less than 75 degrees, so that an acute-angle notched structure is formed at a junction between the second surface and the fin surface for forming an overheated position that promotes generation of bubbles.

In certain embodiments, the angle between the second surface and the fin surface is less than 60 degrees.

In certain embodiments, the functional fins are made of copper, copper alloy, or aluminum alloy.

In certain embodiments, the functional fins are pin-fins or plate-fins.

In certain embodiments, the acute-angle notched structure that is formed between each of the second surfaces and the fin surface is formed by performing a chemical etching on bottom regions of the functional fins.

In certain embodiments, the acute-angle notched structure that is formed between each of the second surfaces and the fin surface is formed by performing a partial processing of forging, compression, or bending on bottom regions of the functional fins.

In certain embodiments, a projection width of an orthogonal projection of the second surface of one of the functional fins onto a top surface of the one of the functional fins is at least one-sixth of a top surface width of the top surface of the one of the functional fins.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
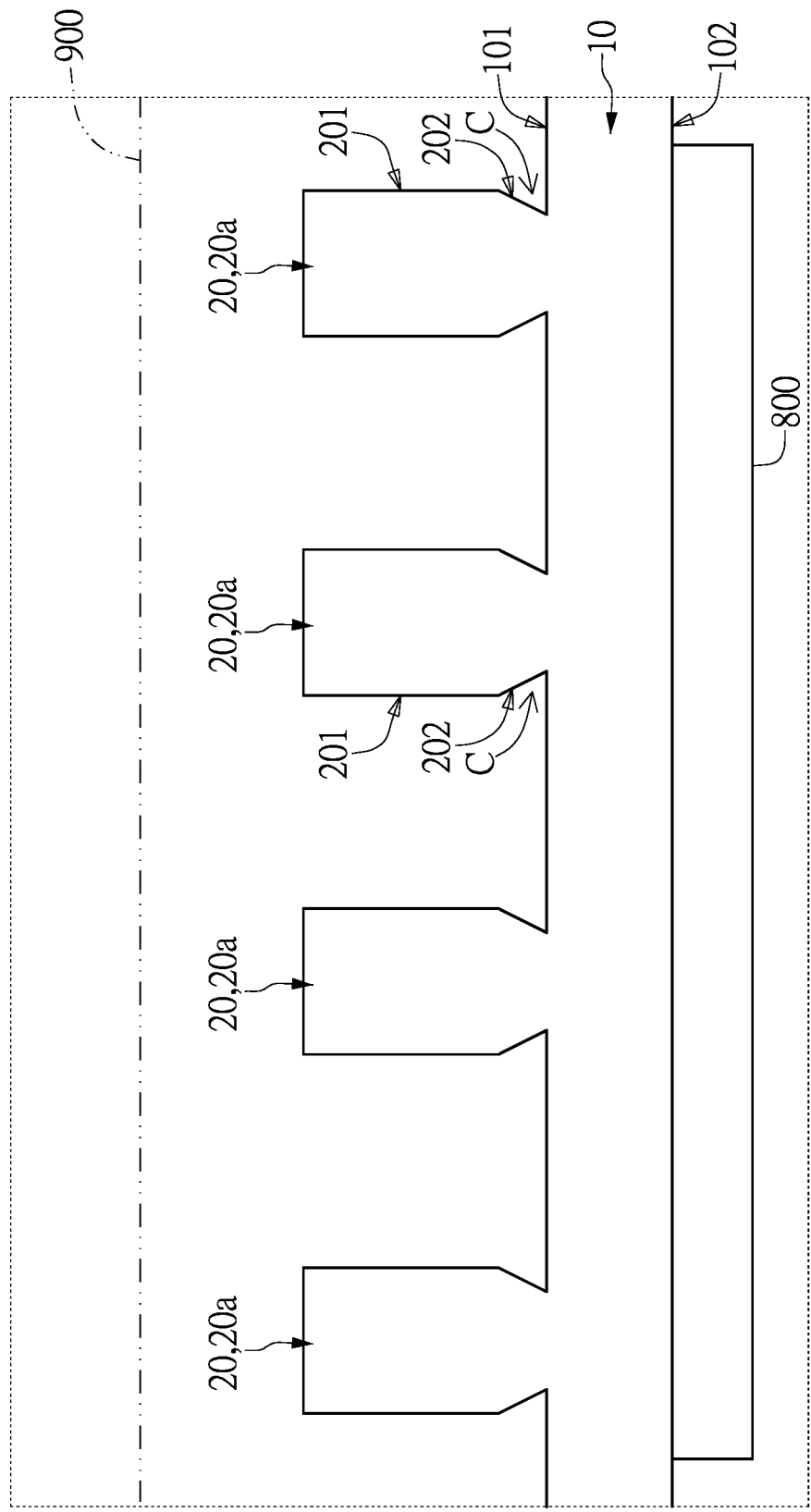
FIG. 1 is a schematic side view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
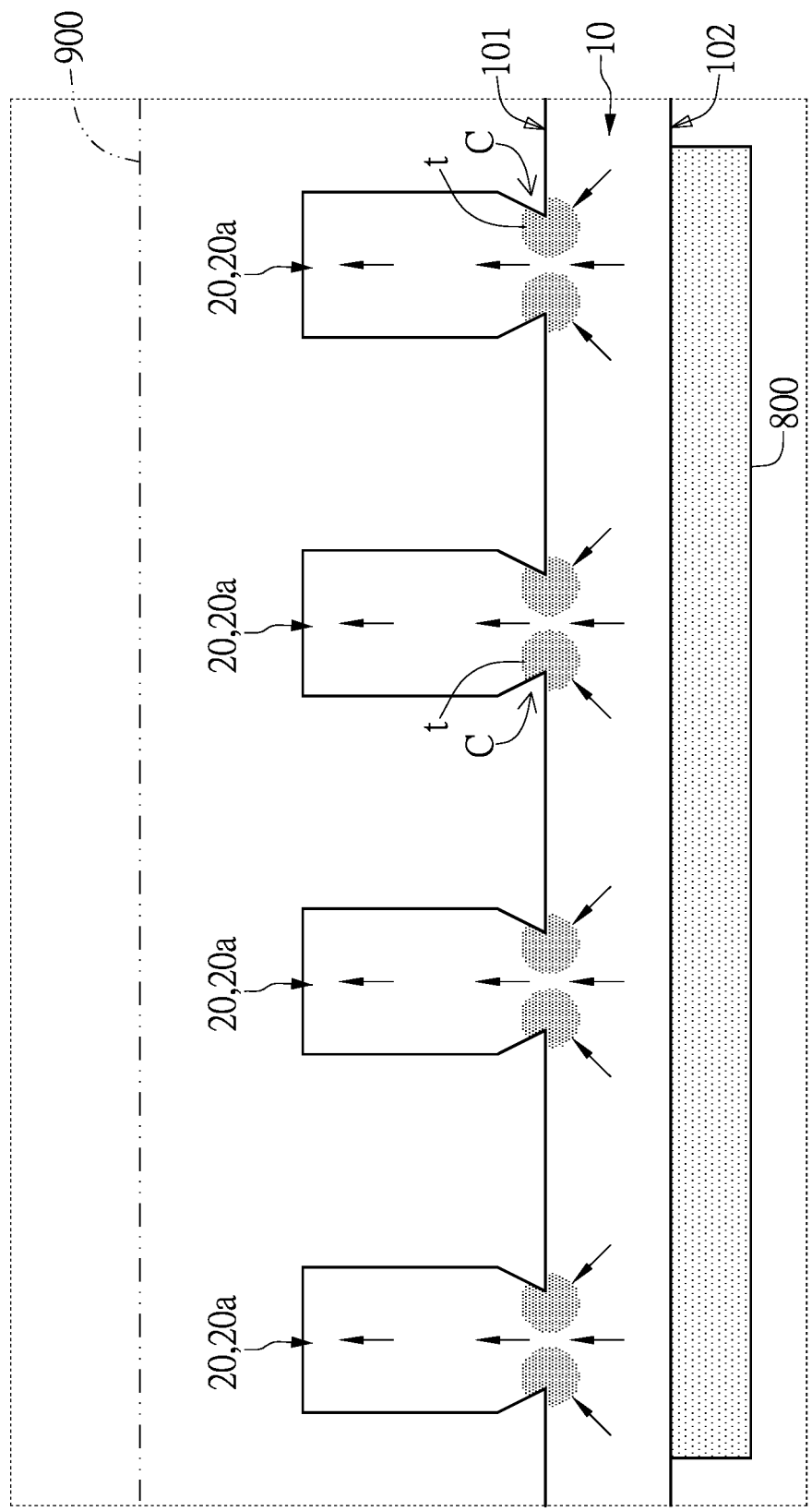
FIG. 2 is a schematic view of a thermal conduction path of a heat source according to the first embodiment of the present disclosure.

Referring to FIG. 1 to FIG. 2, a first embodiment of the present disclosure provides a two-phase immersion-type heat dissipation structure having acute-angle notched structures for contacting a heat source immersed in a two-phase coolant. As shown in FIG. 1, the two-phase immersion-type heat dissipation structure having acute-angle notched structures provided in the present disclosure includes a heat dissipation substrate 10 and a plurality of fins 20.

In this embodiment, the heat dissipation substrate 10 can be made of a material having high thermal conductivity, such as aluminum, copper, or copper alloy. The heat dissipation substrate 10 can be a non-porous heat dissipation plate or a porous heat dissipation plate. Preferably, the heat dissipation substrate 10 can be a porous heat dissipation plate immersed in a two-phase coolant 900 (FLUORINERT™) and having a porosity of greater than 8% such that an amount of bubbles generated is greatly increased so as to improve a heat-dissipation effect.

In this embodiment, the heat dissipation substrate 10 has a fin surface 101 and a non-fin surface 102 that face away from each other. The non-fin surface 102 of the heat dissipation substrate 10 is configured to be in contact (e.g., in a direct contact, or in an indirect contact via an intermediate layer) with a heat source 800 immersed in the two-phase coolant 900. The fin surface 101 of the heat dissipation substrate 10 is connected with the plurality of fins 20, and the heat dissipation substrate 10 and the fins 20 can be integrally connected with each other by metal injection molding or skiving. The heat dissipation substrate 10 and the fins 20 can also be connected by soldering. Moreover, the fins 20 can be pin-fins or plate-fins, and can be made of copper, copper alloy, or aluminum alloy.

In this embodiment, more than half of the plurality of fins 20 are functional fins 20a, and can be located above the heat source 800 or correspond in position to the heat source 800. Moreover, at least one side surface of each of the functional fins has a first surface 201 and a second surface 202 defined thereon that are connected to each other. An angle between the first surface 201 and the fin surface 101 is from 80 degrees to 100 degrees, that is, the first surface 201 and the fin surface 101 are substantially perpendicular to each other. An angle between the second surface 202 and the fin surface 101 is less than 75 degrees, and preferably less than 60 degrees, so that an acute-angle notched structure C is formed at a junction between the second surface 202 and the fin surface 101 for forming an overheated position that promotes generation of the bubbles. Therefore, compared to vertical fins that having a side surface that is perpendicular to a fin surface, in this embodiment, the acute-angle notched structure C is formed jointly by the second surface 202 of the one side surface and the fin surface 101, such that a thermal conduction path of the heat source 800 is limited as shown by arrows of FIG. 2, and a regional high temperature occurs at a tip of a sharp corner as shown by overheated positions t of FIG. 2. Therefore, in this embodiment, the regional high temperature promotes generation of the bubbles, and a contact area of the fins 20 and the two-phase coolant 900 being increased by the acute-angle notched structure also promotes the generation of the bubbles.

In this embodiment, another one side surface of each of the functional fins 20a has a first surface 201 and a second surface 202 defined thereon that are connected to each other. An angle between the first surface 201 and the fin surface 101 is from 80 degrees to 100 degrees, and an angle between the second surface 201 and the fin surface 101 is less than 75 degrees, so that an acute-angle notched structure C is formed at a junction between the second surface 202 of the another one side surface of each of the functional fins 20a and the fin surface 101.

Therefore, in this embodiment, two acute-angle notched structures C are respectively formed at junctions of the second surfaces 202 of the two side surfaces that face away from each other of each of the functional fins 20a and the fin surface 101, thereby further increasing a quantity of regions having regional high temperature and a contact area between the fins 20 and the two-phase coolant 900, so as to further promote the generation of the bubbles.

Furthermore, the acute-angle notched structures C that are formed between the second surfaces 202 and the fin surface 101 can be formed by chemical etching. In detail, the acute-angle notched structures C can be formed by performing a chemical etching on bottom regions of the functional fins 20a by using a chemical solution, and the chemical etching can be performed by using a phosphoric microetching solution, a sulfuric microetching solution, or a ferric chloride etching solution, so as to increase a roughness of the fins 20 for promoting the generation of the bubbles.

Second Embodiment

Figure 3:
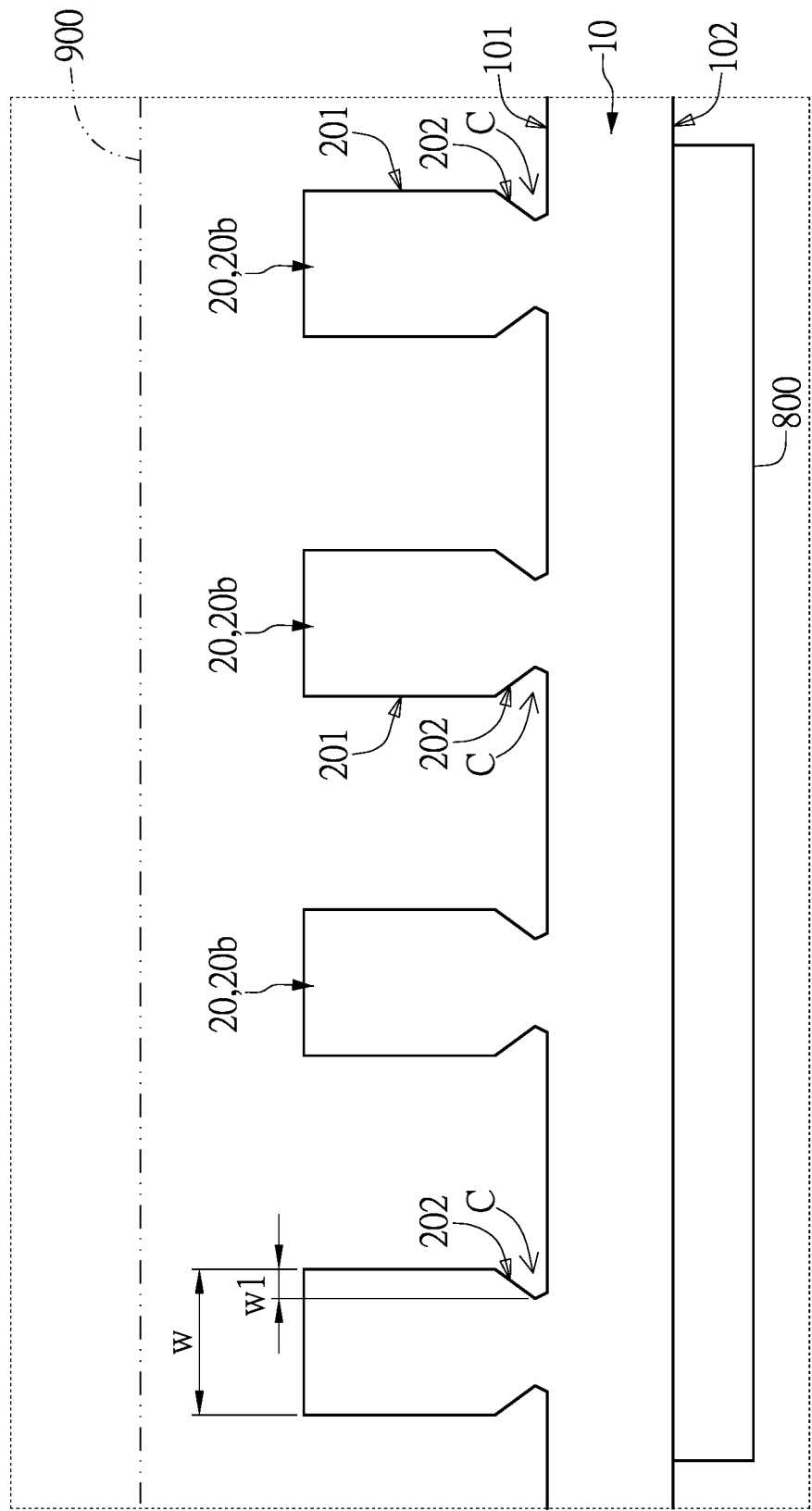
FIG. 3 is a schematic side view of a two-phase immersion-type heat dissipation structure according to a second embodiment of the present disclosure.

Referring to FIG. 3, a second embodiment of the present disclosure is substantially the same as the first embodiment, and the difference therebetween is described as follows.

In this embodiment, in the acute-angle notched structures C that are formed between the second surfaces 202 of the side surfaces of functional fins 20b of the fins 20 and the fin surface 101, due to an incomplete chemical etching, the second surfaces 202 and the fin surface 101 are not completely connected. In other words, the acute-angle notched structures C that are formed between the second surfaces 202 and the fin surface 101 have incomplete sharp corners. The incomplete sharp corners can cause the regional high temperature effect, even if said effect may be slightly decreased. Furthermore, a projection width W1 of an orthogonal projection of the second surface 202 of one of the functional fins 20b onto a top surface of the one of the functional fins 20b is at least one-sixth of a top surface width W of the top surface of the one of the functional fins 20b, so that the regional high temperature effect will be more apparent.

Third Embodiment

Figure 4:
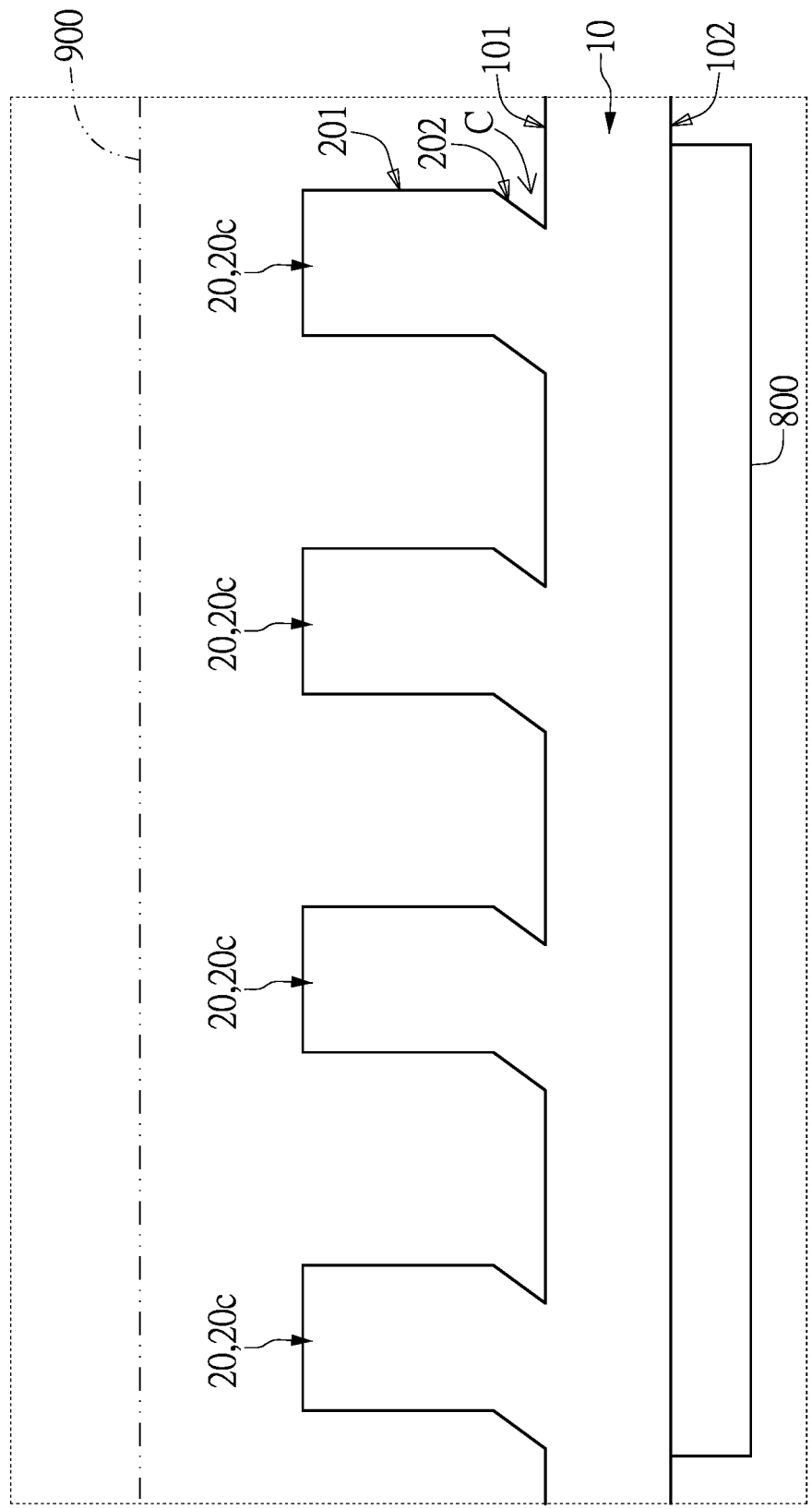
FIG. 4 is a schematic side view of a two-phase immersion-type heat dissipation structure according to a third embodiment of the present disclosure.

Referring to FIG. 4, a third embodiment of the present disclosure is substantially the same as the first embodiment, and the difference therebetween is described as follows.

In this embodiment, the acute-angle notched structures C are only formed between second surfaces 202 of one side surfaces of functional fins 20c of the fins 20 and the fin surface 101. Furthermore, the acute-angle notched structures C formed between the second surfaces 202 of the one side surfaces and the fin surface 101 can be formed by performing a partial processing. That is, the acute-angle notched structures C can be formed by performing forging, compression, or bending on bottom regions of the functional fins 20c.

Beneficial Effects of the Embodiments

In conclusion, in the two-phase immersion-type heat dissipation structure having acute-angle notch structures, by technical features of "the two-phase immersion-type heat dissipation structure including a heat dissipation substrate, and a plurality of fins," "the heat dissipation substrate having a fin surface and a non-fin surface that face away from each other, the non-fin surface being configured to be in contact with a heat source immersed in a two-phase coolant, and the fin surface being connected with the plurality of fins," "more than half of the plurality of fins being functional fins, and at least one side surface of each of the functional fins having a first surface and a second surface defined thereon that are connected to each other," and "an angle between the first surface and the fin surface being from 80 degrees to 100 degrees, and an angle between the second surface and the fin surface being less than 75 degrees, so that an acute-angle notched structure being formed at a junction between the second surface and the fin surface for forming an overheated position that promotes generation of bubbles," an overall immersion-type heat dissipation effect can be effectively improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure, comprising:
   a heat dissipation substrate having a fin surface and a non-fin surface that face away from each other, wherein the non-fin surface is configured to be in contact with a heat source immersed in a two-phase coolant; and
   a plurality of fins, wherein the fin surface is connected with the plurality of fins;
   wherein more than half of the plurality of fins are functional fins, and at least one side surface of each of the functional fins has a first surface and a second surface defined thereon that are connected to each other;
   wherein an angle between the first surface and the fin surface is from 80 degrees to 100 degrees, and an angle between the second surface and the fin surface is less than 75 degrees, so that an acute-angle notched structure is formed at a junction between the second surface and the fin surface for forming an overheated position that promotes generation of bubbles;
   wherein the second surface and the fin surface are planar surfaces and are not completely connected so as to form an incomplete sharp corner at the junction between the second surface and the fin surface;
   wherein a projection width of an orthogonal projection of the second surface of one of the functional fins onto a top surface of the one of the functional fins is at least one-sixth of a top surface width of the top surface of the one of the functional fins.

2. The two-phase immersion-type heat dissipation structure according to claim 1, wherein the angle between the second surface and the fin surface is less than 60 degrees.

3. The two-phase immersion-type heat dissipation structure according to claim 1, wherein the functional fins are made of copper, copper alloy, or aluminum alloy.

4. The two-phase immersion-type heat dissipation structure according to claim 1, wherein the functional fins are pin-fins or plate-fins.

5. The two-phase immersion-type heat dissipation structure according to claim 1, wherein the acute-angle notched structure that is formed between each of the second surfaces and the fin surface is formed by performing a chemical etching on bottom regions of the functional fins.

* * * * *